US006409347B1

(12) United States Patent
Kuroda et al.

(10) Patent No.: US 6,409,347 B1
(45) Date of Patent: Jun. 25, 2002

(54) PROJECTOR, CIRCUIT BOARD, AND ELECTRONIC DEVICE PROVIDED WITH SAID CIRCUIT BOARD

(75) Inventors: Akitoshi Kuroda, Yamagata-mura; Toshihiko Nakazawa; Takeshi Takizawa, both of Shiojiri; Mutsuya Furuhata, Hata-machi; Fumio Koyama, Shiojiri, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/329,361

(22) Filed: Jun. 10, 1999

(30) Foreign Application Priority Data

Jun. 11, 1998 (JP) .......................................... 10-163973
Jun. 22, 1998 (JP) .......................................... 10-175107
Jun. 25, 1998 (JP) .......................................... 10-179273

(51) Int. Cl.[7] ............................. G03B 21/00; H05K 9/00
(52) U.S. Cl. ..................................... 353/31; 361/816
(58) Field of Search ............................ 353/30, 31, 8, 353/38; 361/816; 307/10.1; 439/326

(56) References Cited

U.S. PATENT DOCUMENTS

| 4,473,755 | A | * | 9/1984 | Imai et al. ............... 307/10.1 |
| 4,823,235 | A | * | 4/1989 | Suzuki et al. ............ 361/816 |
| 5,395,262 | A | * | 3/1995 | Lwee ...................... 439/326 |
| 5,418,693 | A | * | 5/1995 | Perry ...................... 361/816 |
| 5,879,065 | A | * | 3/1999 | Shirochi et al. ............. 353/8 |
| 5,951,136 | A | * | 9/1999 | Furuhata et al. ........... 353/31 |
| 6,185,108 | B1 | * | 2/2001 | Okura et al. ............... 361/816 |

* cited by examiner

*Primary Examiner*—Russell Adams
*Assistant Examiner*—Rodney Fuller
(74) *Attorney, Agent, or Firm*—Oliff & Berridge, PLC

(57) ABSTRACT

In a projection display device, a main board that is substantially perpendicular to a plane defined by optical axes of an optical unit is allowed to stand aside the optical unit. Therefore, if the main board is designed to have a small vertical size, the vertical size, i.e., the thickness of the projection display device, can be reduced. Therefore, unlike the conventional projection display device in which the main board is disposed above the optical unit, the entire device can be reliably reduced in thickness and size regardless of the thickness of the main board.

22 Claims, 14 Drawing Sheets

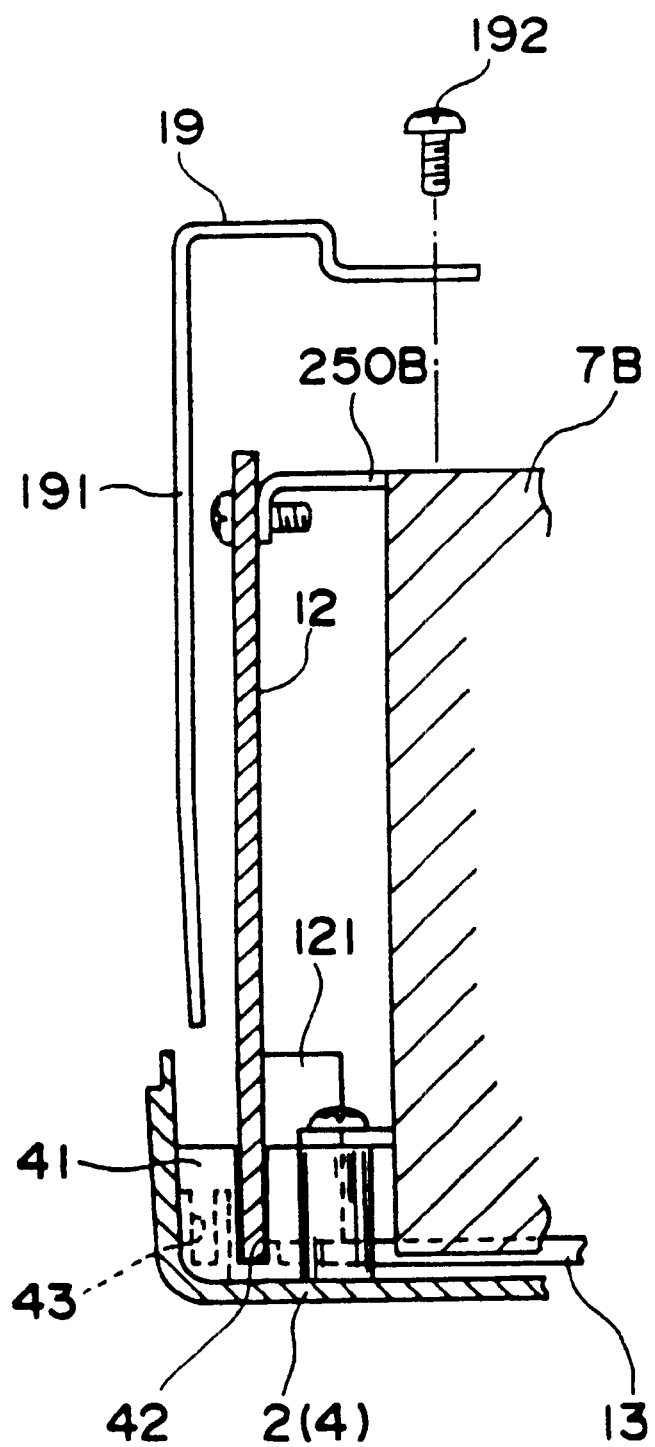
F I G. 7

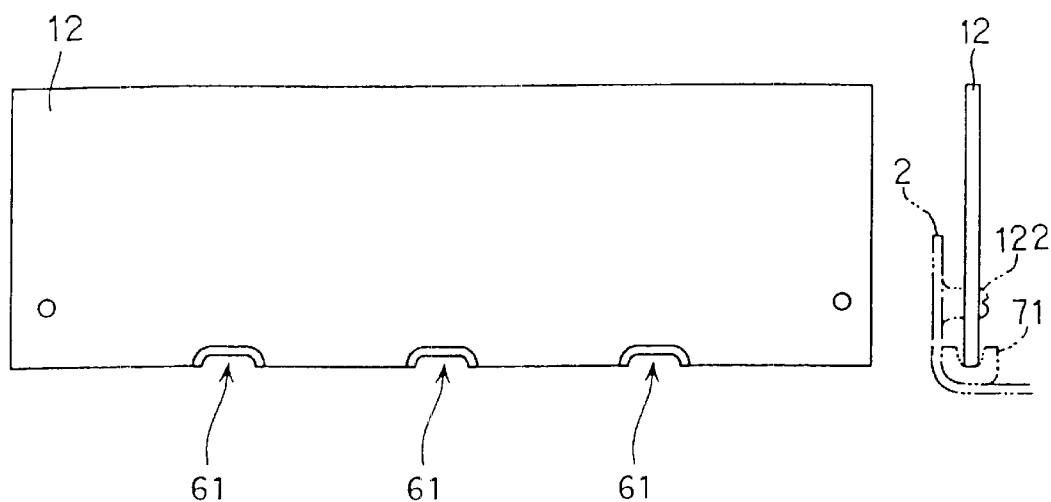
F I G. 10A    F I G. 10B
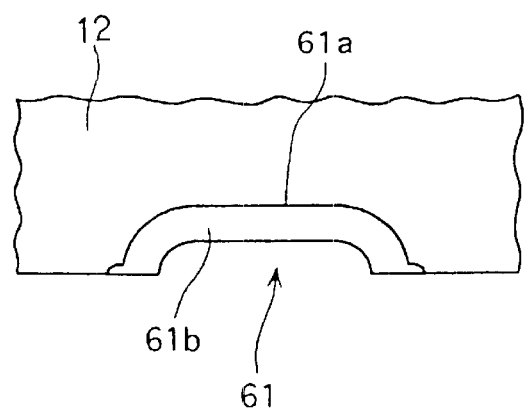
F I G. 11

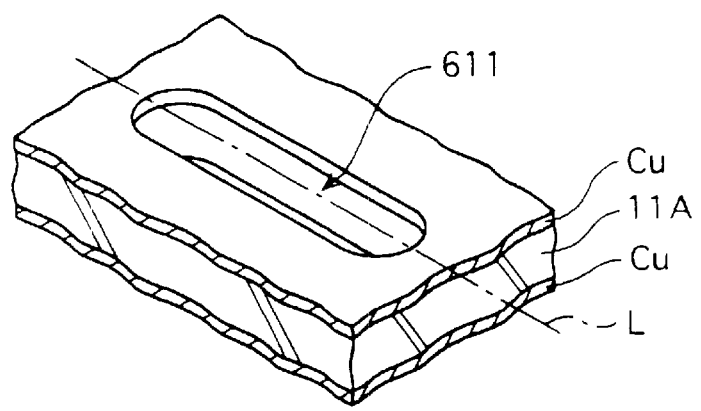
F I G. 12 (A)
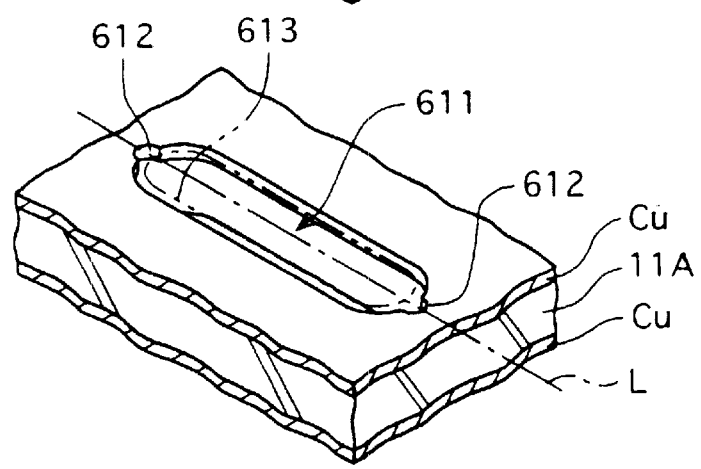
F I G. 12 (B)
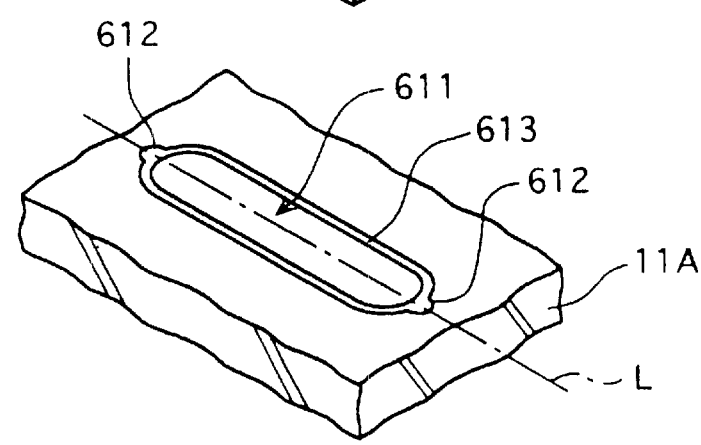
F I G. 12 (C)
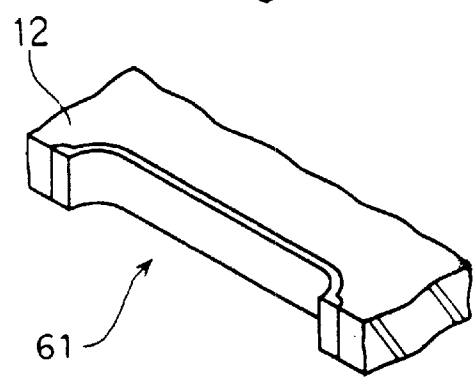
F I G. 12 (D)

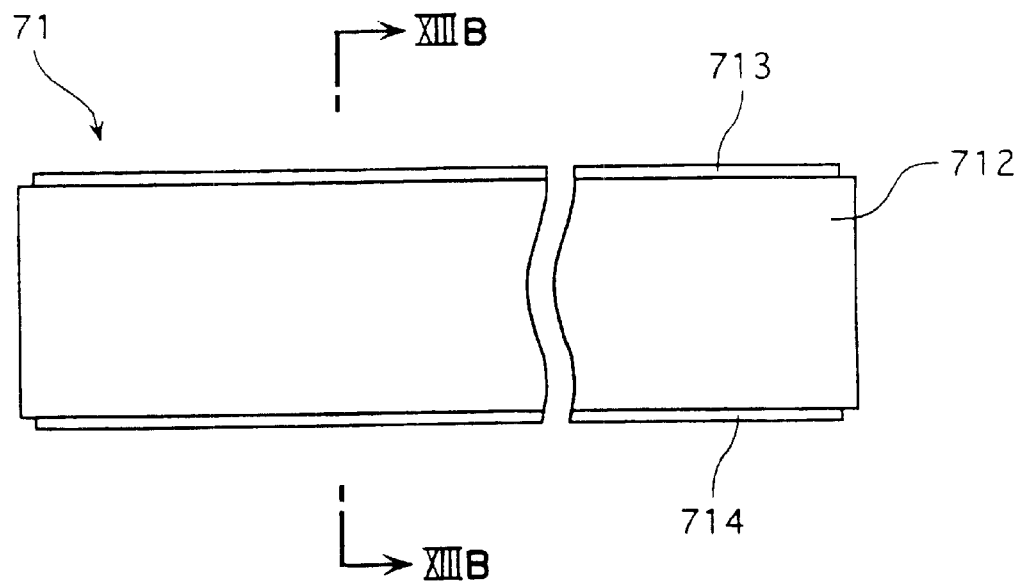
F I G. 13 (A)
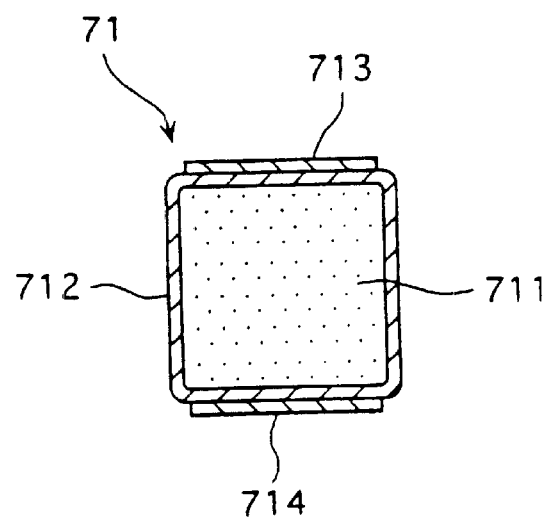
F I G. 13 (B)

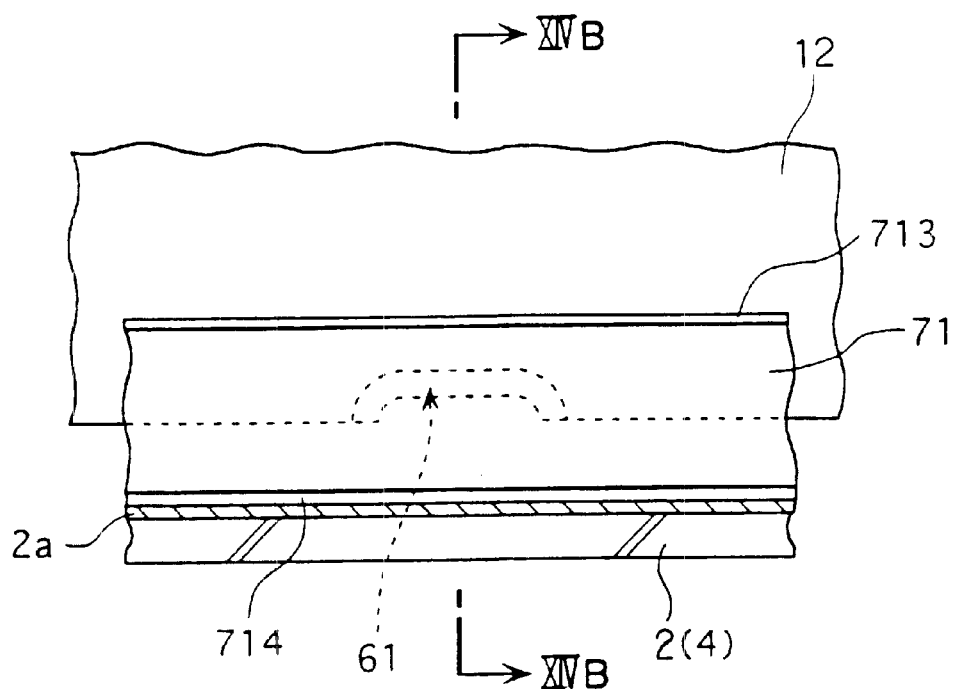
F I G. 14 (A)
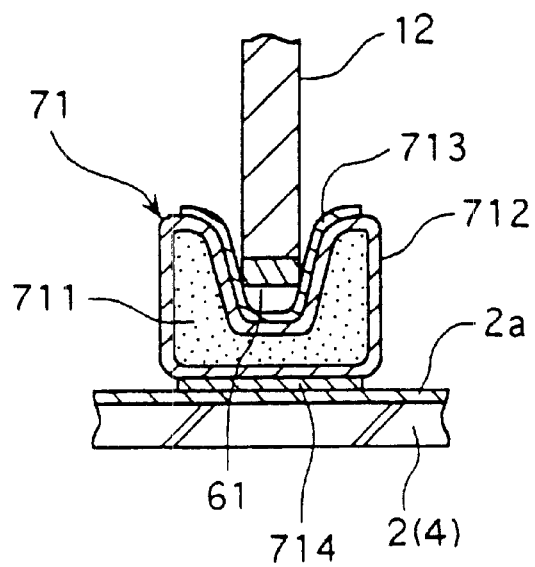
F I G. 14 (B)

F I G. 15 (A)
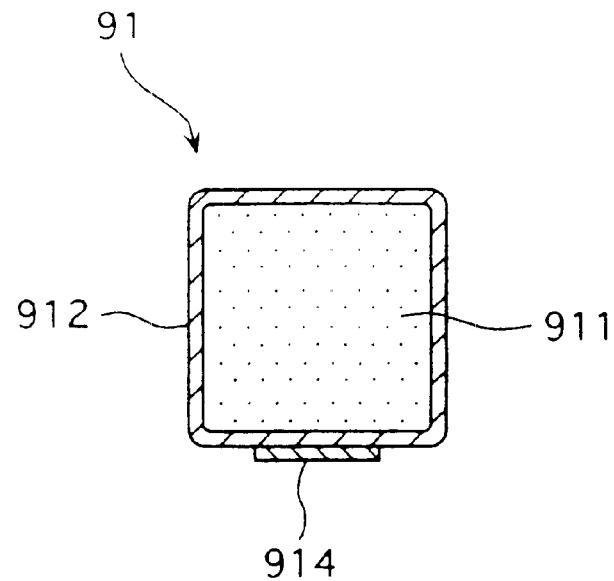
F I G. 15 (B)
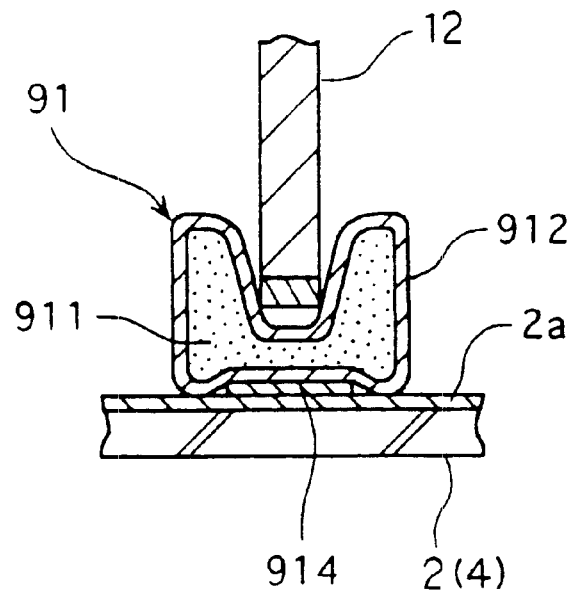

PROJECTOR, CIRCUIT BOARD, AND ELECTRONIC DEVICE PROVIDED WITH SAID CIRCUIT BOARD

BACKGROUND OF THE INVENTION

1. Field of the Invention

The present invention relates to a circuit board accommodated in a casing together with a driving system of an electronic apparatus and to electrically control said driving system, to an electronic apparatus using the circuit board, and to a projection display device serving as such an electronic apparatus.

2. Description of the Related Art

Hitherto, an electronic apparatus has been used which includes a driving system, a circuit board for electrically controlling the driving system, and a casing for accommodating therein the driving system and the circuit board. As such an electronic apparatus, for example, a projection display device has been known which includes an optical system for optically processing a luminous flux emitted from a light source so as to form an optical image according to image information, a driving system including a projection lens for enlarging. and projecting the optical image onto a projection plane, a circuit board for electrically controlling the optical system and the driving system, and a casing for accommodating therein the optical system, the driving system, and the circuit board. In such a projection display device, the circuit board is often disposed above the optical system in parallel with a plane that is defined by an optical axis of the optical system.

The projection display device is widely used in multimedia presentations at conferences, academic meetings, exhibitions, etc., and hence it is necessary to improve portability in order to facilitate transportation of the device to meeting places, and a further reduction in size is demanded.

In order to meet such a demand, however, it is necessary to achieve a reduction in size of components of the optical system and to achieve a reduction in thickness of the circuit board disposed above the optical system. In particular, since the reduction in thickness of the circuit board is limited, the overall device cannot be sufficiently reduced in thickness, and a reduction in size of the device is prevented.

In addition, devices, such as a videocassette recorder and a computer, are connected to such a projection display device, and image information output therefrom is modulated by an optical modulation device constituting the optical system. This allows the projection display device to form an optical image according to the image information. More specifically, a composite signal and an RGB signal serving as image information are supplied to the optical modulation device via an optical-modulation-device driving system for driving and controlling the optical modulation device. The optical-modulation-device driving system converts, by a predetermined signal processing, image signals, such as the composite signal and the RGB signal, into signal forms suitable for image display and supplies the converted signals to a portion for driving the optical modulation device. Such an optical-modulation-device driving has been integrally formed on one circuit board as a circuit for driving the optical modulation device by input image signals.

However, the above conventional optical-modulation-device driving system formed on one circuit board encounters the following problems. That is, the optical-modulation-device driving system includes a portion that is set up according to specifications of the optical modulation device, such as the resolution (such as VGA or SVGA resolution) of the optical modulation device, and a portion that does not depend on the specifications of the optical modulation device, such as a portion for processing the composite signal and the RGB signal so as to be suitable for image display. According to the conventional optical-modulation-device driving system formed on one circuit board, a circuit board including a signal processing portion that does not depend on the specifications of the optical modulation device should be set up specifically according to the specifications of the optical modulation device of the projection display device. This is inefficient from a manufacturing viewpoint.

In addition, formation of the optical-modulation-device driving system on one circuit board increases the size of the circuit board, and this is undesirable for achieving a reduction in size of the projection display device.

Furthermore, in order to ensure a stable operation of the circuit board by preventing noise radiation, a ground section is provided on the inner peripheral surface of the casing of the projection display device, and the ground section and the circuit board are electrically connected.

More specifically, according to the conventional projection display device, the circuit board disposed horizontally above the optical system is fixed to the inner peripheral surface of the casing by a plurality of fixing screws. The fixing screws are electrically connected to the ground section, and noise generated on the circuit board is radiated at the ground section via the fixing screws to thereby achieve a stable operation of the circuit board.

However, since there is a tendency to reduce the weight, size and thickness of the overall electronic apparatus like the above conventional projection display device as described above, grounding of the circuit board by the fixing screws will restrict fixing points of the circuit board. Therefore, the electrical connection between the circuit board and the ground section via the fixing screws cannot be sufficiently effected. In addition to the electrical connection by the fixing screws, the electrical connection between the circuit board and the ground section may be achieved by providing a special connecting line on the circuit board, but this complicates the structure of the circuit board and is not desirable from the viewpoint of reducing the size of the device.

SUMMARY OF THE INVENTION

It is an object of the present invention to provide a projection display device capable of reliably reducing the thickness and size thereof without being affected by the thickness of a circuit board.

A projection display device of the present invention is intended to achieve the above object by changing a layout of a circuit board. More specifically, according to an aspect of the present invention, there is provided a projection display device including an optical system for optically processing a luminous flux emitted from a light source so as to form an optical image according to image. information; a projection lens for enlarging and projecting an image formed by the optical system onto a projection plane; a circuit board for controlling the device; and a casing for substantially covering the optical system, the projection lens, and the circuit board in entirety, characterized in that the circuit board is substantially perpendicular to a plane defined by optical axes of the optical system, and is disposed longitudinally on an outside of the plane defined in the optical system.

In the projection display device of the present invention, when the plane defined by the optical axes of the optical system is set horizontally, for example, the circuit board is allowed to stand aside the optical system. Therefore, by designing the circuit board so as to have a small size, the entire thickness of the projection display device can be reduced because the circuit board is not disposed above the optical system. Therefore, unlike the conventional projection display device in which a circuit board is disposed above an optical system, the thickness of the entire device can be reliably reduced regardless of the thickness of the circuit board, whereby a reduction in size of the device is sufficiently facilitated.

In addition, in the projection display device of the present invention, the circuit board may be disposed in such a manner that one surface of the circuit board closely oppose an inner surface of the casing, and a guard member may be provided between the circuit board and the casing so as to prevent interference therebetween.

That is, the guard member is provided between the circuit board and the casing, so that interference between the casing and the circuit board is prevented. In particular, the circuit board can be effectively prevented from being damaged. In addition, this allows the casing to be easily mounted, whereby efficiency of assembly work can be improved.

In the projection display device of the present invention, the guard member may include a metal planar section for covering a predetermined area of the circuit board.

In this case, the circuit board is protected from external noise, and malfunction of the circuit is prevented.

Furthermore, in the projection display device of the present invention, the casing may be provided with a supporting section for supporting the circuit board, whereby the mounting operation of the circuit board is facilitated.

In addition, in the projection display device of the present invention, a power-supply circuit board may be provided separately from the circuit board, and an electric power for driving a control circuit on the circuit board may be produced by a power-supply circuit on the power-supply circuit board.

In this case, the electric power for driving the control circuit formed on the circuit board is produced on the power-supply circuit board provided separately from the circuit board, so that the control circuit becomes resistant to received noise, as compared with a case where the power supply circuit is formed on the circuit board. Therefore, it becomes difficult for the malfunction of the control circuit to occur, whereby reliability is increased.

It is another object of the present invention to provide a projection display device including a light source, an optical system for optically processing a luminous flux emitted from the light source so as to form an optical image according to image information, and a projection lens for enlarging and projecting an image formed by the optical system onto a projection plane which can achieve commonality of components, improve productivity, and contribute to reduced size of the device.

To achieve the above object, according to another aspect of the present invention, there is provided a projection display device including an optical system for optically processing a luminous flux emitted from a light source so as to form an optical image according to image information; a projection lens for enlarging and projecting an image formed by the optical system onto a projection plane, characterized in that an optical-modulation-device driving system for driving and controlling an optical modulation device constituting the optical system is provided, and that the optical-modulation-device driving system is divided into an individual-setting section set according to specifications of the optical modulation device and a common-setting section set in common without depending on the specifications of the optical modulation device.

The above individual-setting section includes, for example, a phase expansion circuit for expanding an image signal supplied as serial data according to the resolution of the optical modulation device. In addition, the common-setting section includes, for example, a look-up table (LUT) for outputting a drive controlling signal for allowing the optical modulation device to display a predetermined color according to the input image signal, and a CPU for setting and controlling table information for the LUT.

In addition, various types of elements, such as an active-matrix driving liquid crystal element, an electro-luminescent element, and a plasma display element may be employed as the above optical modulation element. Furthermore, the optical-modulation-device driving system may drive and control simultaneously a plurality of optical modulation display devices, like a three-sheet projection display device for modulating each color of red (R), green (G), and blue (B).

According to the present invention, the optical-modulation-device driving system is divided into the individual-setting section and the common-setting section, so that only the individual-setting section may be changed even if the optical modulation device in the projection display device has different specifications, whereby management of components can be rationalized and productivity of the projection display device can be improved. In addition, the optical-modulation-device driving system is divided into the individual-setting section and the common-setting section, so that versatility of arrangement of the optical-modulation-device driving system in the projection display device is increased, thereby contributing to reduced size of the device.

In the projection display device, the individual-setting section and the common-setting section may be formed on two separate circuit boards, respectively, and the circuit boards may be stacked.

That is, the circuit board on which the individual-setting section is formed and the circuit board on which the common-setting section is formed are stacked, so that electrical connection between the two circuit boards can be easily established, whereby the productivity of the device can be further improved. In addition, two circuit boards are stacked, so that it is possible to efficiently cool the optical-modulation-device driving system by introducing cooling air into a space formed between the two circuit boards.

In addition, the individual-setting section may be provided with an information carrier circuit for carrying setting information for the optical modulation device, and the common-setting section may be provided with a correction circuit for obtaining setting information for the optical modulation device from the information carrier circuit, correcting the input image information based on the setting information, and outputting the corrected information.

As the information carrier circuit, an information carrier circuit including switching elements selectable between Low and High, an information carrier circuit including a non-volatile storage unit for recording setting information for the optical modulation device, and an information carrier circuit which may consist of the switching elements and the storage unit may be employed.

As the correction circuit, a correction circuit may be employed which includes an LUT for outputting a drive controlling signal for allowing the optical modulation device to display a predetermined color based on the input image signal, and a CPU for setting and controlling table information of the LUT based on the setting information obtained from the information carrier circuit.

That is, the individual-setting section includes the information carrier circuit, so that the setting information carried by the information carrier circuit can be obtained by the correction circuit of the common-setting section so as to correct the image signal. Therefore, even if the optical modulation device has different characteristics, it is possible to suitably ensure color reproducibility of a projected image of the projection display device.

In addition, when the information carrier circuit includes selectable switching elements, the information carrier circuit can carry relatively simple information, such as a resolution of the optical modulation device. More specifically, when the information carrier circuit carries setting information about the resolution, the resolution can be recognized by the following combinations of the Low-and-High selectable switching elements.

| Resolution | SW1 | SW2 |
|---|---|---|
| VGA, SVGA | Low | Low |
| XGA | Low | High |
| SXGA | High | High |

Furthermore, when the information carrier circuit includes a non-volatile storage unit, the information carrier circuit can carry complicated setting information, such as an applied voltage and light transmission characteristics of the optical modulation device, and setting information for a plurality of optical modulation devices can be recorded in one storage unit. As the non-volatile storage unit, an Erasable Programmable Read Only Memory (EPROM), or an Electrically Erasable Programmable Read Only Memory (E2PROM) may be employed. In brief, various types of storage units may be employed so long as they are information-writable units and they do not lose recorded information even if the power of the projection display device is shut off.

It is a further object of the present invention to provide a circuit board accommodated in a casing together with a driving system of an electronic apparatus so as to electrically control the driving system, and an electronic apparatus using the circuit board which can prevent generation and intrusion of noise into the circuit board without depending on a layout direction, and secure a stable circuit operation.

According to a further aspect of the present invention, there is provided a circuit board accommodated in a casing together with a driving system of an electronic apparatus so as to electrically control the driving system, characterized in that the casing is provided with a ground section for preventing radiation of noise produced inside the casing and for preventing intrusion of external noise into the casing, and that the circuit board includes an electrical conducting portion provided on the outer peripheral end of the circuit board, and electrically connected to the ground section.

An electrical conducting portion provided along the entire outer periphery of the circuit board, an electrical conducting portion provided on a part of an outer peripheral end, and electrical conducting portions provided at a plurality of points may be employed as the above-described electrical conducting portion.

According to the present invention, the electrical conducting portion is provided on the outer peripheral end of the circuit board. Therefore, when the electrical conducting portion is brought into contact with the ground section provided inside the casing, electrical connection therebetween can be established, whereby generation and intrusion of noise into the circuit board is prevented without depending on a layout direction of the circuit board, and a stable circuit operation is ensured.

In the circuit board, an electrical conducting portion composed of a metal conducting portion that is formed on at least a part of the outer peripheral end of the circuit board may be preferably employed as the electrical conducting portion. More specifically, the metal conducting portion can be formed by forming a metal plated layer on the outer peripheral end of the circuit board, or by covering the outer peripheral end of the circuit board with a metal plate.

For example, the metal plated layer can be formed on the metal conducting portion as follows. First, a long through-hole having the metal plated inner peripheral surface is formed in a printed wiring circuit board. Then, the circuit board is cut along the length of the through-hole to divide the circuit board, whereby a metal plated layer is exposed to the outer peripheral end of the circuit board to form the metal conducting portion.

When the metal conducting portion is formed of a metal plated layer, in forming the printed wiring on the circuit board, the electrical conducting portion can be formed simultaneously in a step for forming the through-hole, whereby manufacturing of the above circuit board can be facilitated. In addition, when the electrical conducting portion is formed of a metal plate covering the outer peripheral end of the circuit board, the electrical conducting portion can be formed after preparing the circuit board, and the electrical conducting portion can be formed successively along the outer peripheral end of the circuit board.

According to a still further aspect of the present invention, there is provided an electronic apparatus including a driving system; a circuit board for electrically controlling the driving system; and a casing for accommodating therein the driving system and the circuit board, characterized in that the casing is provided with a ground section for preventing radiation of noise produced inside the casing and for preventing intrusion of external noise into the casing, and a holding member electrically connected to the ground section and holding the circuit board, that the circuit board is provided with an electrical conducting portion formed on an outer peripheral end of the circuit board and electrically connected to the ground section, and that the electrical conducting portion and the ground section are electrically connected via the holding member.

According to the present invention, the ground section of the casing and the electrical conducting portion of the circuit board are electrically connected via the holding member, so that it is not necessary to provide a special connecting line, etc. on the circuit board, and the circuit board and the ground section can be easily electrically connected.

In the electronic apparatus, a holding member composed of a metal member engaging with the circuit board may be employed as the above-described holding member, but a holding member may preferably be composed of an elastic member that is deformed according to a contact condition of the circuit board. More specifically, a strip holding member composed of a spongy elastic member and a conductive sheet provided on an outer peripheral surface of the elastic member may be employed as the holding member.

That is, the holding member is composed of the elastic member and the conductive sheet provided on the outer peripheral surface of the elastic member, so that the holding member is deformed according to the contact condition of the circuit board, whereby electrical connection between the ground section and the electrical conducting portion can be reliably established via the conductive sheet of the holding member.

A ground section having a metal plate attached to the inside of the casing may be employed as the above-described ground section, but a ground section composed of a shield plated layer formed on an inner surface of the casing may preferably be employed.

That is, the ground section is composed of the shield plated layer formed on the inner surface of the casing, so that the ground section can be easily formed in the outer casing, the ground section can be simplified, and the inner structure of the electronic apparatus can be simplified, whereby the size of the electronic apparatus can be further reduced.

BRIEF DESCRIPTION OF THE DRAWINGS

FIG. 7 is a sectional view showing a principal part of the projection display device of the first embodiment;

FIG. 10 includes a front view and a side view, each showing a main board according to a second embodiment of the present invention;

FIG. 11 is an enlarged view showing a principal part of the main board of the second embodiment;

FIGS. 12A to 12D are perspective views for the explanation of a method for forming the principal part of the main board of the second embodiment;

FIG. 13A is a side view and FIG. 13B is a sectional view taken along the line XIII—XIII of FIG. 13A, respectively, each showing a holding member for supporting the main board of the second embodiment;

FIG. 14A is a side view and FIG. 14B is a sectional view taken along the line XIV—XIV of FIG. 14A, respectively, each showing a supporting structure of the main board of the second embodiment; and FIGS. 15A and 15B are sectional views, respectively, each showing a modification of the main board of the second embodiment.

DESCRIPTION OF THE PREFERRED EMBODIMENTS

Embodiments of the present invention will now be described with reference to the drawings.

First Embodiment (1) Overall Configuration of the Device

Figure 1:
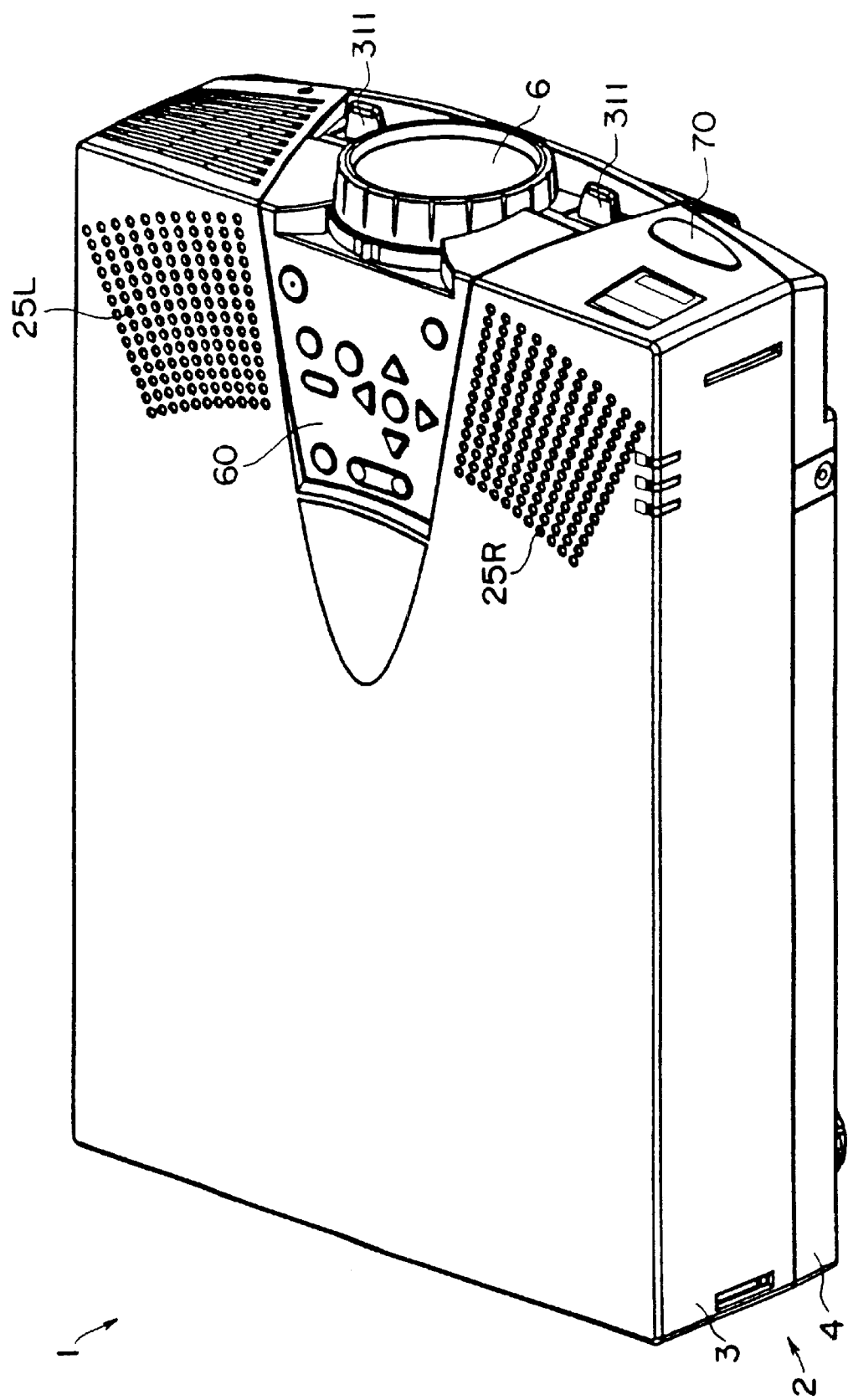
FIG. 1 is a perspective view showing a projection display device according to a first embodiment of the present invention, as viewed from the top.
Figure 2:
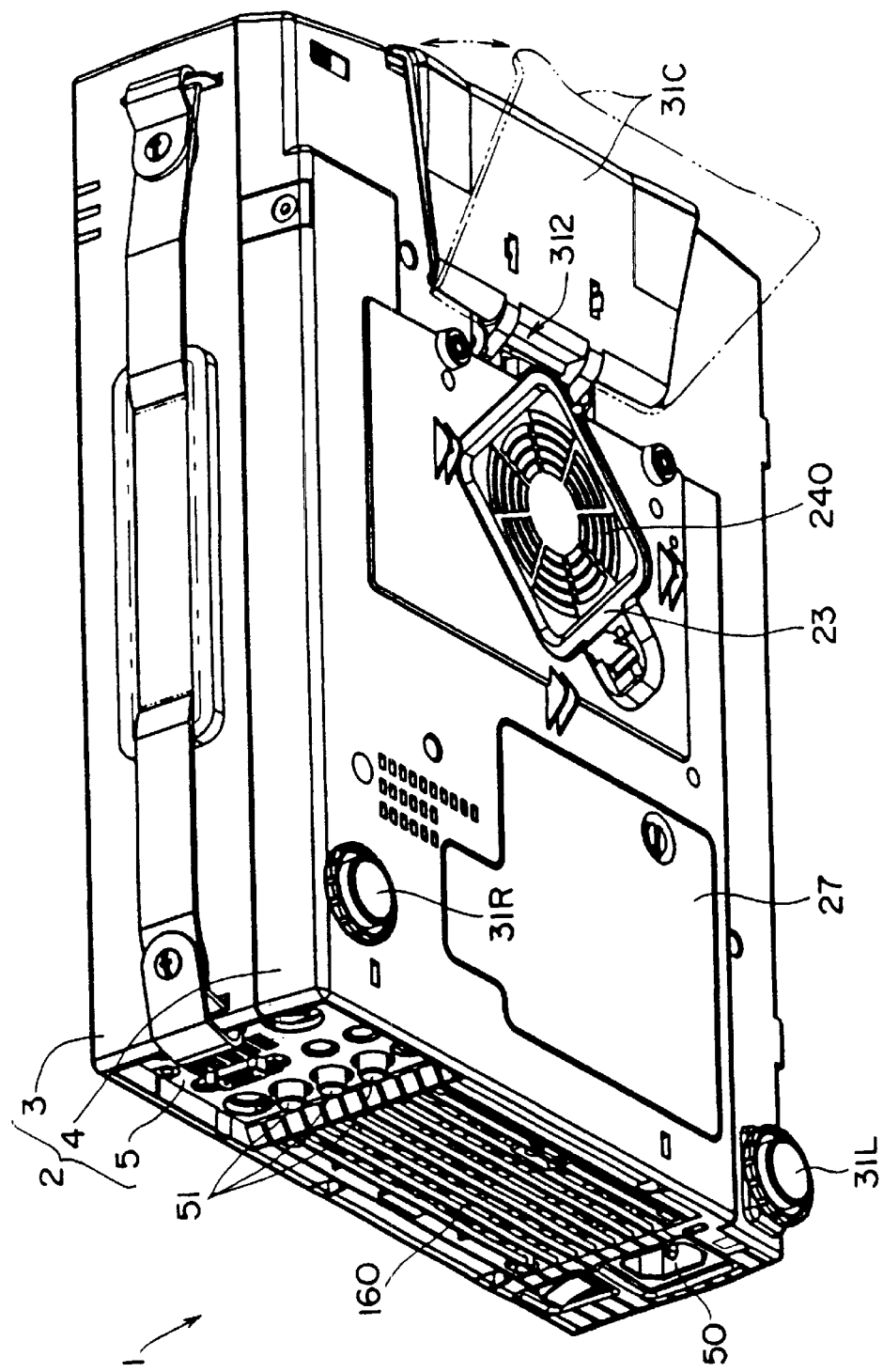
FIG. 2 is a perspective view showing the projection display device of the first embodiment, as viewed from the bottom.

FIGS. 1 and 2 are schematic perspective views of a projection display device 1 according to a first embodiment of the present invention. FIG. 1 is a perspective view as viewed from the top, and FIG. 2 is a perspective view as viewed from the bottom.

The projection display device 1 is of the type that separates a luminous flux emitted from a light source lamp into three primary colors of red (R), green (G), and blue (B), modulates the luminous fluxes of the three colors according to image information through liquid crystal panels (modulation systems), synthesizes the modulated luminous fluxes of respective colors by a prism (color synthesizing optical system), and enlarges and displays the synthesized luminous fluxes onto a projection plane via a projection lens 6. Components of an optical unit 10 (to be described hereinbelow) except the projection lens 6 are accommodated in an outer casing 2.

(2) Structure of Outer Casing

The outer casing 2 basically consists of an upper casing 3 for covering the top surface of the device, a lower casing 4 constituting the bottom surface of the device, and a rear casing 5 (FIG. 2) for covering a rear surface.

As shown in FIG. 1, many communication holes 25L and 25R are formed at the left and right sides of the front end of the top surface of the upper casing 3. Control switches 60 for controlling image quality or the like of the projection display device 1 is provided in substantially the center of the top surface of the upper casing 3. Furthermore, a light-receiving section 70 is provided at the lower left portion of the front of the upper casing 3 so as to receive an optical signal from a remote controller (not shown).

As shown in FIG. 2, on the bottom surface of the lower casing 4, there are provided a lamp-exchanging cover 27 for exchanging a tight source lamp unit 8 accommodated inside (to be described hereinbelow), and an air filter cover 23 having formed therein an air inlet 240 for cooling the inside of the device.

In addition, the bottom surface of the lower casing 4 is provided, as shown in FIG. 2, with a foot 31C at substantially the center of the front end, and feet 31R and 31L at the right and left rear corners, respectively. The foot 31C is rotated by a rear-side rotating mechanism 312 (FIG. 2) by raising levers 311 shown in FIG. 1, and is urged into an open state in which it is separated on its front end from the main body of the device, as shown by a two-dot chain line in FIG. 2. By controlling the amount of rotation of the foot 31C, the vertical position of a display screen on the projection plane can be changed. On the other hand, the feet 31R and 31L are extended or retracted by being rotated, and the inclination of the display screen can be changed by controlling the amount of extension or retraction thereof.

An AC inlet 50 for external power supply, and various types of input-output terminals 51 are disposed on the rear casing 5, as shown in FIG. 2, and an air outlet 160 for exhausting air from inside the device is formed adjacent to the input-output terminals 51.

(3) Internal Structure of the Device

Figure 3:
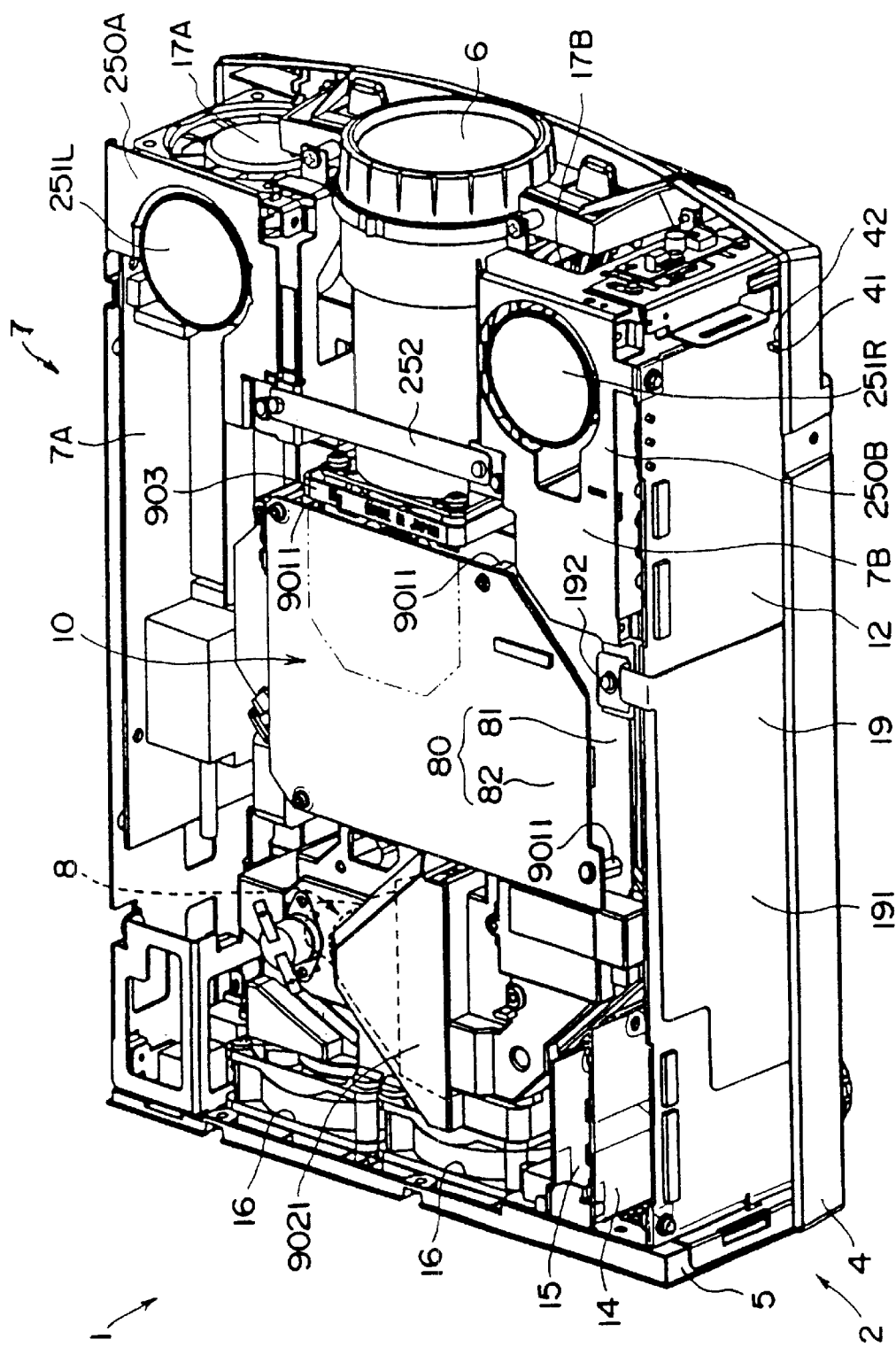
FIG. 3 is a perspective view showing the internal structure of the projection display device of the first embodiment.
Figure 4:
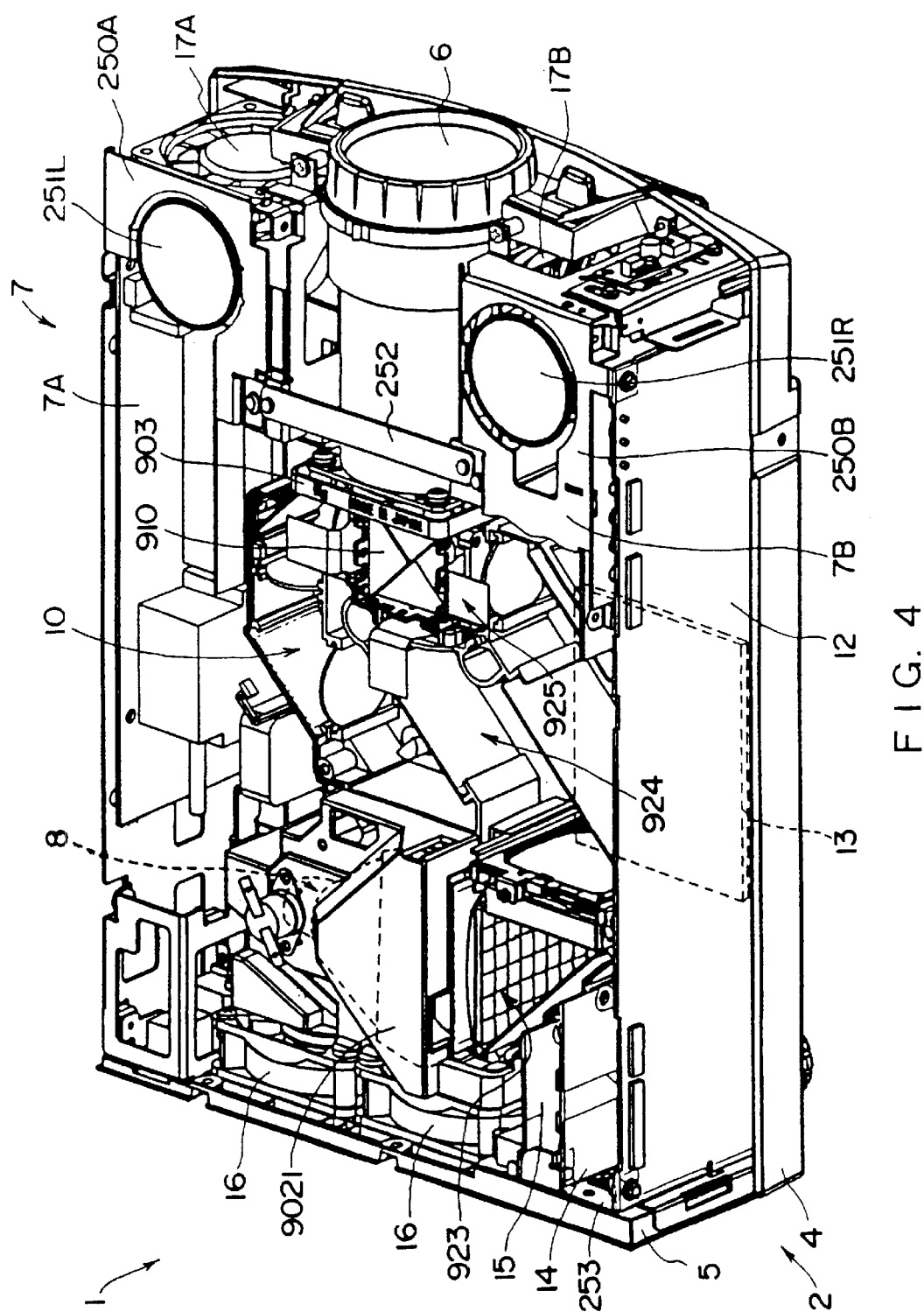
FIG. 4 is a plan view showing an optical system provided in the projection display device of the first embodiment.
Figure 5:
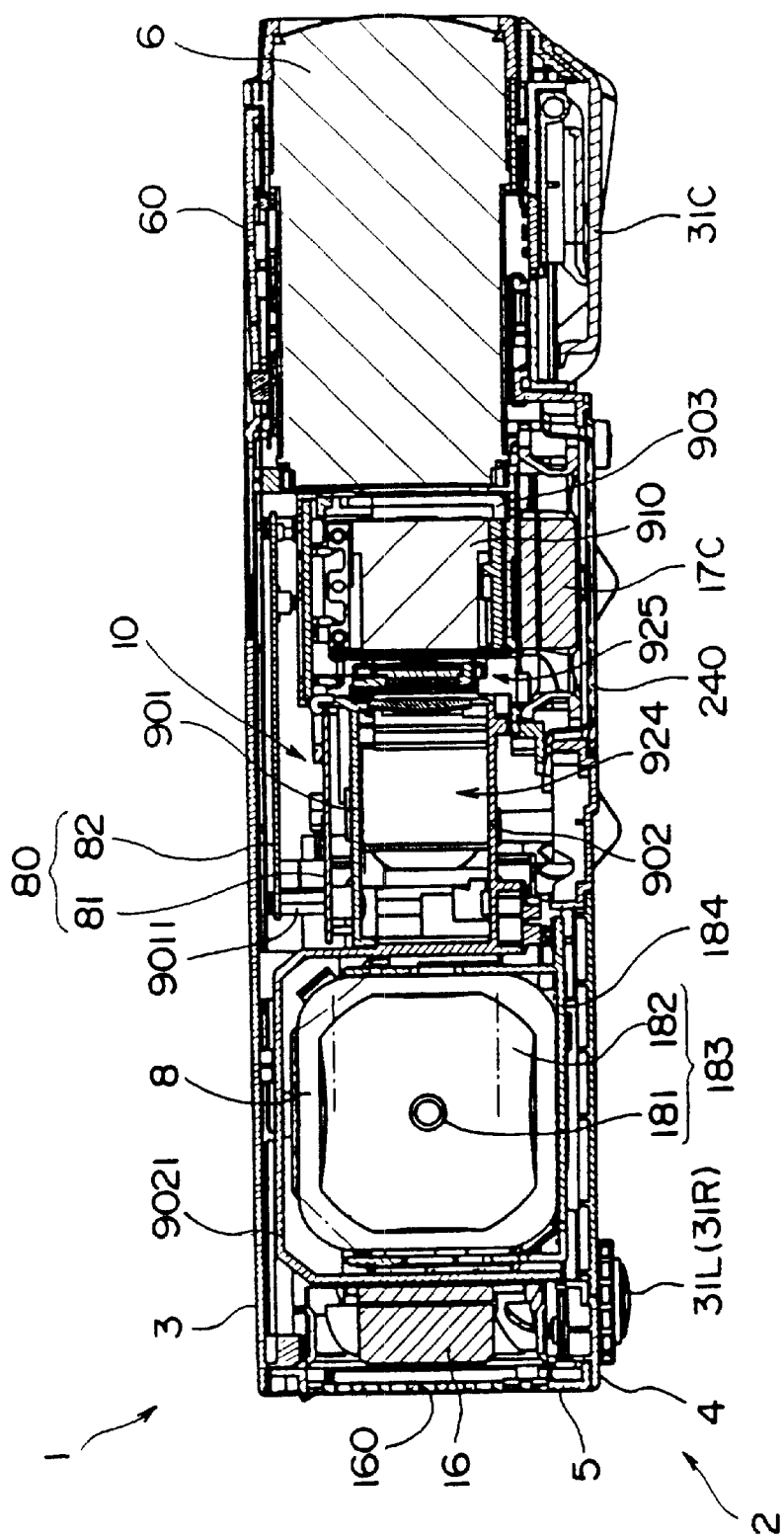
FIG. 5 is a sectional view showing the inner structure of the projection display device of the first embodiment.

FIGS. 3 to 5 show the internal structure of the projection display device 1. FIGS. 3 and 4 are schematic perspective views of the inside of the device, and FIG. 5 is a vertical sectional view of the projection display device 1.

As shown in these drawings, inside the outer casing 2, there are disposed a power supply unit 7, a light source lamp unit 8, an optical unit 10 constituting the optical system, a driver board 80, consisting of two circuit boards, that serves as an optical-modulation-device driving system, and a main board 12 serving as a circuit board.

The power supply unit 7 consists of first and second power supply blocks 7A and 7B, respectively, disposed on both sides of the projection lens 6. The first power supply block 7A transforms electric power obtained via the AC inlet 50 to supply power mainly to the second power supply block 7B and to the light source lamp unit 8. The second power supply block 7B further transforms and supplies the electric power obtained from the first power supply block 7A, and the electric power is mainly supplied to a power-supply circuit board 13 (shown by a dotted line in FIG. 4) disposed below the optical unit 10, and to first and second intake fans 17A and 17B disposed adjacent to the power supply blocks 7A and 7B, respectively. Furthermore, a power supply circuit on the power-supply circuit board 13 transforms the electric power from the second power supply block 7B to produce various electric powers. The second intake fan 17B is disposed between the second power supply block 7B and the projection lens 6 so as to draw cooling air from the outside into the inside through a clearance formed between the projection lens 6 and the upper casing 3 (FIG. 1). Metal casings 250A and 250B constituting the power supply blocks 7A and 7B, respectively, are provided with speakers for outputting sounds 251R and 251L at positions corresponding to the communicating holes 25R and 25L, respectively. The metal casings 250A and 250B are connected to each other at the top by a metal bar 252 and at the bottom by a metal member (not shown), and are grounded.

The light source lamp 8 constitutes a light source portion of the projection display device 1, and includes a light source device 183 consisting of a light source lamp 181 and a reflector 182, and a lamp housing 184 for accommodating therein the light source device 183. The light source lamp unit 8 is covered with an accommodating section 9021 that is integrally formed with a lower light guide 902 (FIG. 5) so as to be removed from the lamp-exchanging cover 27. A pair of exhaust fans 16 are provided at the back of the accommodating section 9021 on the left and right sides at positions corresponding to an air outlet 160 of the rear casing 5. Cooling air drawn by the first to third intake fans 17A to 17C is introduced by the exhaust fans 16 into the accommodating section 9021 from an opening formed in the vicinity thereof, the light source lamp unit 8 is cooled by the cooling air, and then the cooling air is exhausted from the air outlet 160. Electric power of each exhaust fan 16 is supplied from the power-supply circuit board 13.

The optical unit 10 is a unit for optically processing a luminous flux emitted from the light source lamp unit 8 to form an optical image according to image information, and includes an illuminating optical system 923, a color separation optical system 924, a modulation system 925, and a prism unit 910 serving as a color synthesizing optical system. The optical elements in the optical unit 10 other than the modulation system 925 and the prism unit 910 are vertically held between an upper light guide 901 and the lower light guide 902. These upper and lower light guides 901 and 902, respectively, are integrally formed, and are fixed by fixing screws on the side of the lower casing 4. In addition, these upper and lower light guides 901 and 902, respectively, are fixed by fixing screws on the side of the prism unit 910.

Figure 6:
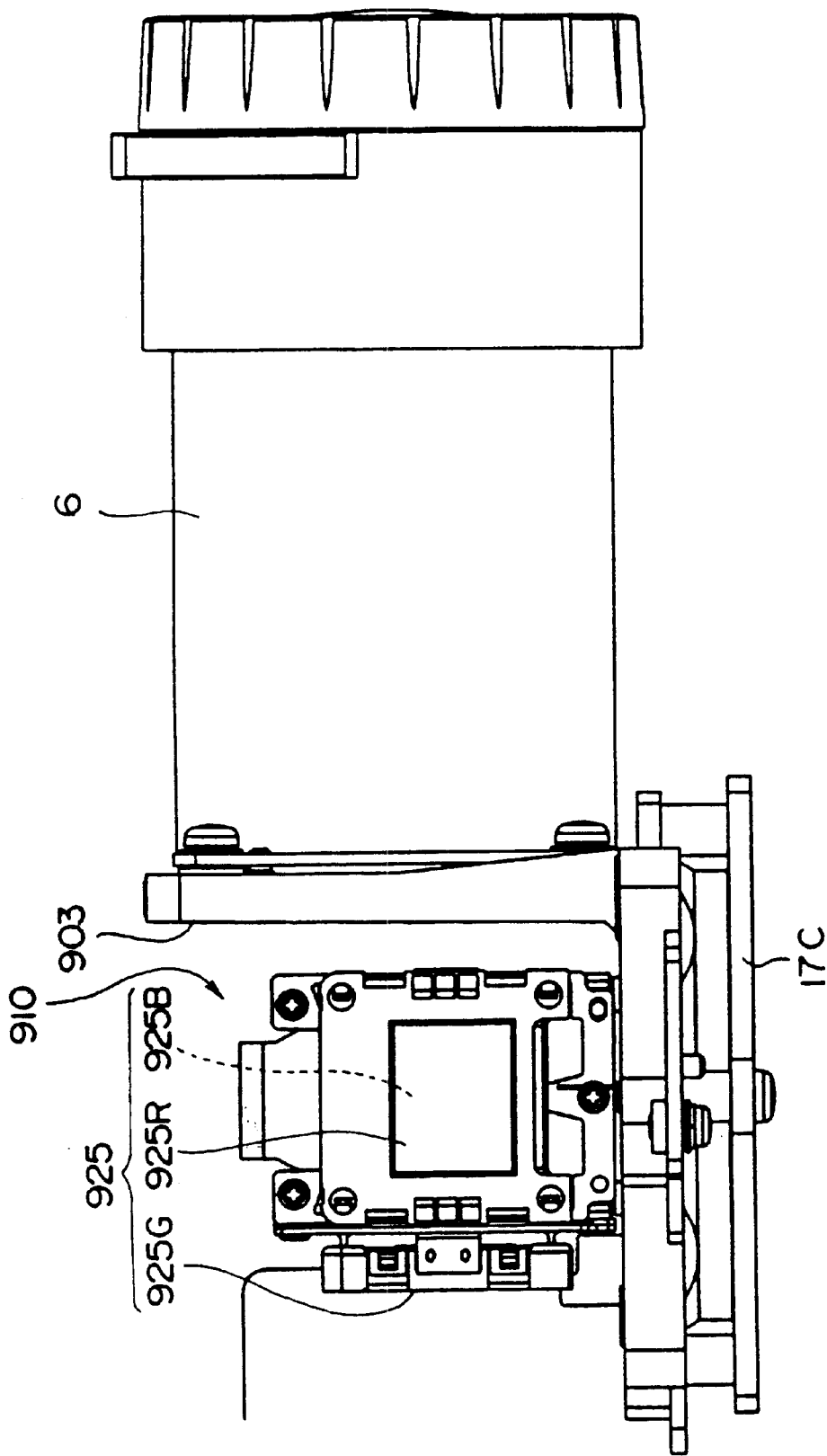
FIG. 6 is a sectional view showing a structure according to the first embodiment in which a modulation system, a color synthesizing optical system, and a projection lens are mounted.

The prism unit 910 shaped like a rectangular parallelepiped is, as shown in FIG. 6, fixed by fixing screws to the back side of a head body 903, which is a structure, substantially L-shaped in cross section, formed by an integrally molded magnesium component. In addition, respective liquid crystal panels 925R, 925G, and 925B, constituting the modulation system 925, are disposed to oppose three side surfaces of the prism unit 910, and are fixed to the head body 903 by fixing screws. The liquid crystal panel 925B is provided at the position opposed to the liquid crystal panel 925R across the prism unit 910 (FIG. 8), and only an extension line (dotted line) and a reference numeral thereof are shown in FIG. 6. These liquid crystal panels 925R, 925G, and 925B are cooled by the third intake fan 17C that is provided on the lower surface of the head body 903 corresponding to the air inlet 240. In this case, electric power for the third intake fan 17C is supplied from the power-supply circuit board 13 via the driver board 80. Furthermore, the base-end of the projection lens 6 is fixed to the front surface of the head body 903 by fixing screws. The head body 903 thus having mounted thereon the prism unit 910, the modulation system 925, and the projection lens 6 is fixed to the lower casing 4 by fixing screws, as shown in FIG. 5.

The driver board 80 drives and controls the respective liquid crystal panels 925R, 925G, and 925B of the modulation system 925, and includes an individual-setting board 81 and a common-setting board 82. The individual-setting board 81 and the common-setting board 82 are stacked above the optical unit 10, are separated from each other via a stud bolt 9011, and many elements (not shown) for forming a control circuit are mounted on their opposing surfaces. Both boards 81 and 82 are electrically connected by connectors (not shown) provided on the opposing surfaces at corresponding positions.

The cooling air drawn by the third intake fan 17C is supplied to a space between the individual-setting board 81 and the common-setting board 82 after cooling the liquid crystal panels 925R, 925G, and 925B, and cools circuit elements on the respective boards 81 and 82.

The main board 12 has a control circuit formed thereon for controlling the entire projection display device 1, is substantially perpendicular to a plane defined by optical axes 1a, 1r, 1g, and 1b of the optical unit 10 described hereinbelow, and is allowed to stand aside the optical unit 10. One surface of the main board 12 closely opposes the inner surface of the outer casing 2. The main board 12 is electrically connected to an interface substrate 14 having the input-output terminals 51 formed thereon and to a video substrate 15, in addition to the driver board 80 and the control switches 60, and is connected to the power-supply circuit board 13 via the connector 121, as shown in FIG. 7. The control circuit of the main board 12 is driven by electric power produced by the power-supply circuit on the power-supply circuit board 13. The main board 12 is cooled by cooling air flowing from the second intake fan 17B through the second power supply block 7B.

Referring to FIGS. 3 and 7, the main board 12 is fixed by a fixing screw to the metal casing 250B of the second power supply block 7B at the front upper end thereof, and a ground (GND) line of the main board 12 is grounded through the fixing screw and the metal casing 250B. As shown in FIG. 4, the main board 12 is fixed to a holding member 253, made of metal, by fixing screws together with the interface substrate 14 and the video substrate 15 at the rear upper end thereof. As shown in FIG. 7, a part of the front lower end of the main board 12 is engaged with a slit 42, serving as a supporting section, provided on a rib 41 of the lower casing 4.

A guard member 19 made of metal, such as aluminum, is disposed between the main board 12 and the outer casing 2.

The guard member 19 includes a large planar section 191 spreading between the top and bottom ends of the main board 12, is fixed at the upper side to the meta casing 250B of the second power supply block 7B by a fixing screw 192, and is engaged with another slit 43 (FIG. 7) of the lower casing 4 at the lower end. Consequently, interference between the upper casing 3 and the main board 12 is prevented when the upper casing 3 is mounted to the lower casing 4, and the main board 12 is protected from external noise.

(4) Structure of the Optical System

Figure 8:
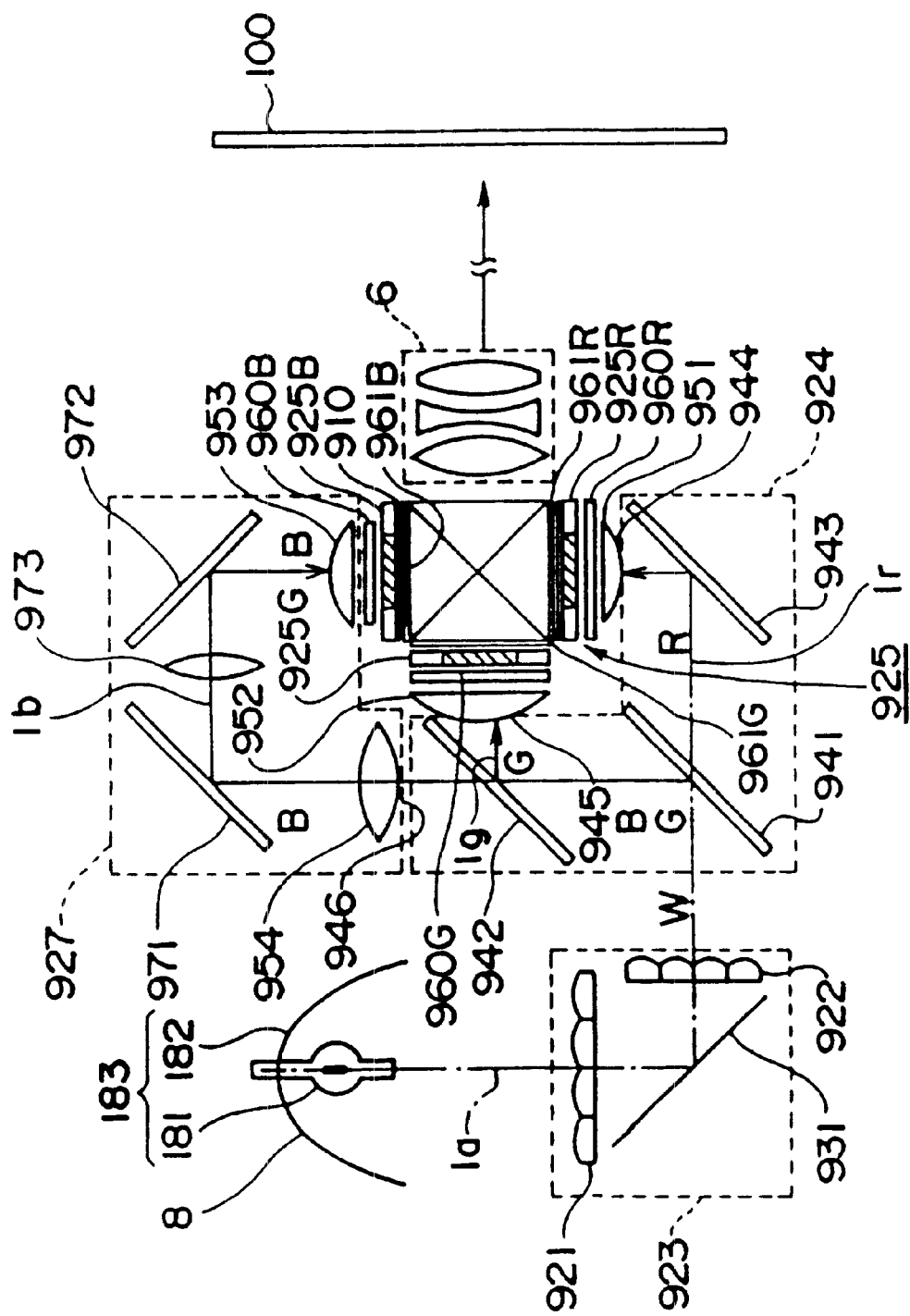
FIG. 8 is a schematic view for the explanation of the optical system in the projection display device of the first embodiment.

The structure of the optical system, i.e., the optical unit 10 of the projection display device 1 will now be described with reference to a schematic view shown in FIG. 8.

As described above, the optical unit 10 includes the illuminating optical system 923 for providing a uniform in-plane illuminance distribution of a luminous flux (W) from the light source lamp unit 8, the color separation optical system 924 for separating the luminous flux (W) from the illuminating optical system 923 into color luminous fluxes of red (R), green (G), and blue (B), the modulation system 925 for modulating the respective color luminous fluxes R, G, and B according to the image information, and the prism unit 910 serving as the color synthesizing optical system for synthesizing the respective modulated color luminous fluxes.

The illuminating optical system 923 includes a reflecting mirror 931 for bending the optical axis 1a of the luminous flux W emitted from the light source lamp unit 8 toward the front of the device, and a first lens plate 921 and a second lens plate 922 disposed on both sides of the reflecting mirror 931.

The first lens plate 921 includes a plurality of rectangular lenses arranged in the form of a matrix, divides the luminous flux emitted from the light source into a plurality of partial luminous fluxes, and condenses the respective partial luminous fluxes near the second lens plate 922.

The second lens plate 922 includes a plurality of rectangular lenses arranged in the form of a matrix, and has the function of superimposing partial luminous fluxes emitted from the first lens plate 921 onto the liquid crystal panels 925R, 925G, and 925B (to be described hereinbelow) constituting the modulation system 925.

In the projection display device 1 of this embodiment, since the liquid crystal panels 925R, 925G, and 925B can be illuminated with light having a substantially uniform illuminance by the illuminating optical system 923, a projected image having no illuminance variations can be obtained.

The color separation optical system 924 is composed of a blue-green reflecting dichroic mirror 941, a green reflecting dichroic mirror 942, and a reflecting mirror 943. First, a blue luminous flux B and a green luminous flux G, included in the luminous flux (W) emitted from the illuminating optical system 923, are perpendicularly reflected by the blue-green reflecting dichroic mirror 941, and travel toward the green reflecting dichroic mirror 942.

The red luminous flux R passes through the blue-green reflecting dichroic mirror 941, is perpendicularly reflected by the reflecting mirror 943 located at the rear thereof, and is emitted from an emitting section 944 for the red luminous flux R toward the prism unit 910. Then, only the green luminous flux G of the blue and green luminous fluxes B and G reflected by the blue-green reflecting dichroic mirror 941 is perpendicularly reflected by the green reflecting dichroic mirror 942, and is emitted from an emitting section 945 for the green luminous flux G toward the prism unit 910. The blue luminous flux B passing through the green reflecting dichroic mirror 942 is emitted from an emitting section 946 for the blue luminous flux B toward a light guide system 927. In this embodiment, all of the distances between the emitting section for the luminous flux W of the illuminating optical system 923 and the emitting sections 944, 945, and 946 for the color luminous fluxes R, G, and B, respectively, of the color separation optical system 924 are set to be equal.

Condenser lenses 951 and 952 are disposed on the emitting sides of the emitting sections 944 and 945 for the red and green luminous fluxes R and G in the color separation optical system 924, respectively. Therefore, the red and green luminous fluxes R and G emitted from the emitting sections enter the condenser lenses 951 and 952, respectively, where they are collimated.

The red and green luminous fluxes R and G thus collimated pass through incident-side polarizers 960R and 960G, respectively, and enter the liquid crystal panels 925R and 925G, respectively, where they are modulated and given corresponding image information. That is, these liquid crystal panels 925R and 925G are subjected to switching control according to image information by the driver board 80, whereby each color light passing therethrough is modulated. On the other hand, the blue luminous flux B is guided to the corresponding liquid crystal panel 925B via a light guide system 927, where it is similarly modulated according to image information. Liquid crystal panels using a polysilicon TFT as a switching element may be employed for the liquid crystal panels 925R, 925G, and 925B of this embodiment.

The light guide system 927 is composed of a condenser lens 954 disposed on the emitting side of the emitting section 946 for the blue luminous flux B, an incident-side reflecting mirror 971, an emitting-side reflecting mirror 972, an intermediate lens 973 disposed between these reflecting mirrors, and a condenser lens 953 disposed before the liquid crystal panel 925B. The blue luminous flux B emitted from the condenser lens 953 passes through an incident-side polarizer 960B to enter the liquid crystal panel 925B, where it is modulated. In this case, the optical axis 1a of the luminous flux W, and the optical axes 1r, 1g, and 1b of the color luminous fluxes R, G, and B are formed in the same plane, and the main board 12 is provided so as to be perpendicular to the plane. The blue luminous flux B has the longest optical path length among the color luminous fluxes, that is, the distance between the light source lamp 181 and the liquid crystal panel for the blue luminous flux B is the longest, and hence, the amount of light of the blue luminous flux B to be lost is the largest. The light loss, however, can be restricted by interposing the light guide system 927 therebetween.

The color luminous fluxes R, G, and B, modulated through the liquid crystal panels 925R, 925G, and 925B, respectively, pass through emitting-side polarizers 961R, 961G, and 961B to enter the prism unit 910, where they are synthesized. A color image synthesized by the prism unit 910 is enlarged and projected via the projection lens 6 onto a projection plane 100 located at a predetermined position.

(5) Structure of the Optical Modulation Device Driving and Controlling Method(Driver Board) 80

Figure 9:
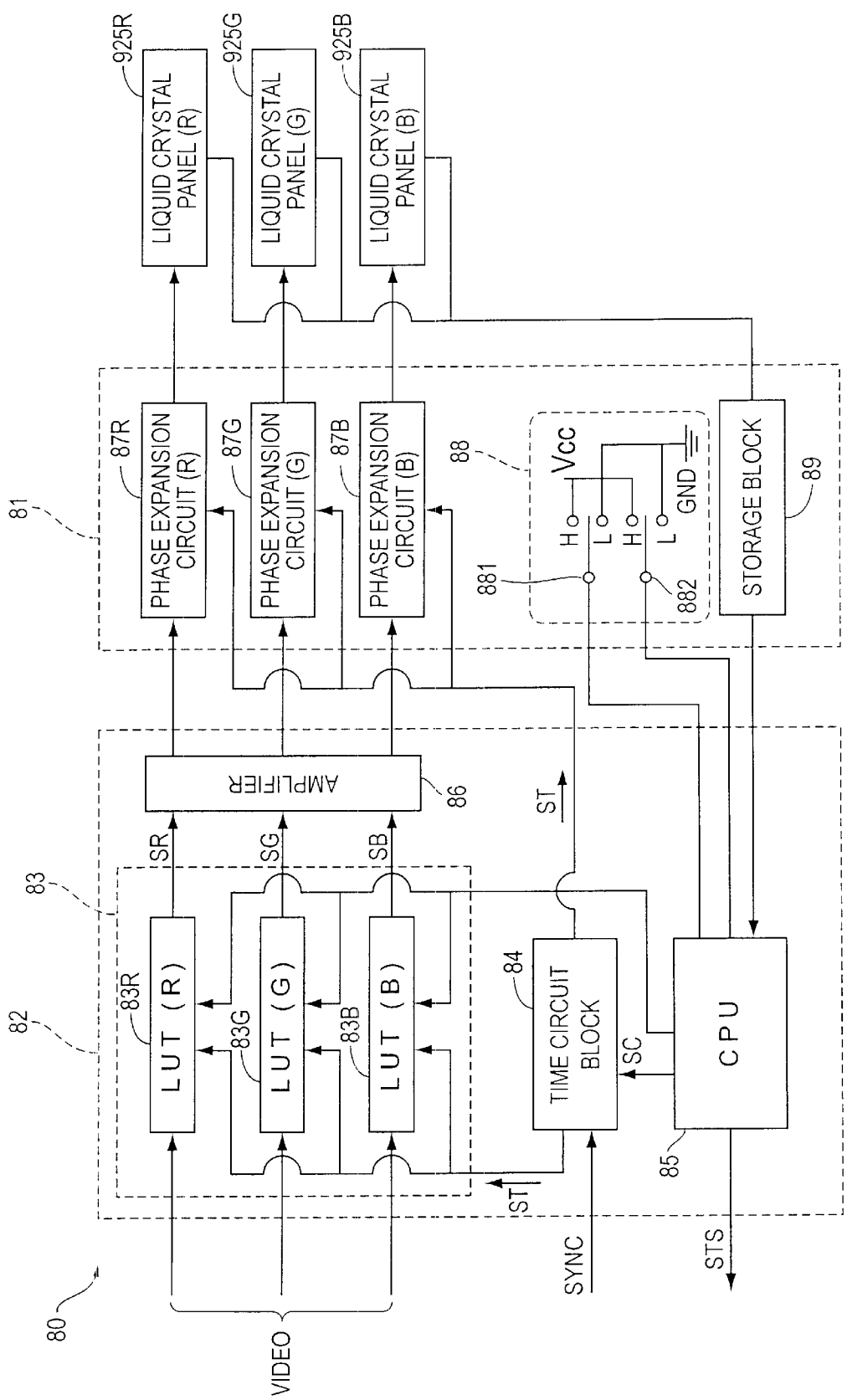
FIG. 9 is a block diagram showing a structure of an optical-modulation-device driving means in the projection display device of the first embodiment.

The driver board 80, as shown in a block diagram in FIG. 9, includes the individual-setting board 81 that is set according to specifications of the liquid crystal panels 925R, 925G, and 925B, and the common-setting board 82 that is set in common without depending on the specifications of the liquid crystal panels 925R, 925G, and 925B.

The common-setting board 82 includes a signal processing block 83, a timing circuit block 84, a CPU 85, and an amplifier 86, and the signal processing block 83 and the CPU 85 form a correction circuit.

The signal processing block 83 is a block for outputting drive controlling signals SR, SG, and SB for displaying suitable colors on the liquid crystal panels 925R, 925G, and 925B, respectively, based on an image signal VIDEO input from the input-output terminals 51 of the interface substrate 14 via the video substrate 15. The signal processing block 83 is set according to the respective liquid crystal panels 925R, 925G, and 925B, and includes three look-up tables (LUTs) 83R, 83G, and 83B each containing a D/A converter.

The timing circuit block 84 is a block for outputting a drive timing signal ST to the signal processing block 83, to phase expansion circuit blocks 87R, 87G, and 87B described hereinbelow, and to driver ICs (not shown) provided on the liquid crystal panels 925R, 925G, and 925B, respectively, based on a vertical or horizontal synchronizing signal SYNC.

The CPU 85 controls the signal processing block 83 and the timing circuit block 84. The CPU 85 sets and controls table information for the LUTs 83R, 83G, and 83B, respectively, or controls outputs of the timing circuit block 84. In addition, the CPU 85 is electrically connected to a switching element block 88 and to a storage block 89 described hereinbelow so as to obtain information carried by these blocks. Drive controlling signals SR, SG, and SB are D/A converted by the D/A converters contained in the LUTs 83R, 83G, and 83B, respectively, and are amplified by the amplifier 86 to be output to the individual-setting board 81.

The individual-setting board 81 includes the phase expansion circuit blocks 87R, 87G, and 87B, the switching element block 88, and the storage block 89, and the phase expansion circuit blocks 87R, 87G, and 87B are connected to the liquid crystal panels 925R, 925G, and 925B, respectively.

The phase expansion circuit blocks 87R, 87G, and 87B expand phases of the drive controlling signals SR, SG, and SB according to the resolution of the liquid crystal panels 925R, 925G, and 925B, respectively. By expanding the phases of the drive controlling signals, the liquid crystal panels 925R, 925G, and 925B that are essentially operated at low speed can be operated quickly according to the change of a image signal VIDEO. The phase expansion circuit blocks 87R, 87G, and 87B of this embodiment can be formed by a combination of a plurality of ICs (not shown) that are set to have a predetermined number of expanded phases. More specifically, each of the phase expansion circuit blocks 87R, 87G, and 87B is provided with four connections (not shown) for connecting an IC that expands a signal to six phases. One IC is connected to one connection to expand the signal to six phases when the resolution of the liquid crystal panels 925R, 925G, and 925B is VGA and SVGA resolutions, two ICs are connected to two connections to expand the signal to twelve phases when the resolution is XGA resolution, and four ICs are connected to four connections to expand the signal to twenty four phases when the resolution is SXGA resolution.

The switching element block 88 is composed of two resistance switches 881 and 882 that are selectable between Low and High, and a combination of selected conditions of the two resistance switches 881 and 882 can determine the resolution to which the individual-setting board 81 can respond. In this embodiment, the resolution is determined by the following combinations.

| Resolution | SW 881 | SW 882 |
|---|---|---|
| VGA, SVGA | Low | Low |
| XGA | Low | High |
| SXGA | High | High |

The storage block 89 is composed of a non-volatile E2PROM that does not lose recorded contents even if the power of the projection display device 1 is shut off, and setting information for the respective liquid crystal panels 925R, 925G, and 925B is recorded therein. The setting information can include characteristic value information, such as deviation of the respective liquid crystal panels 925R, 925G, and 925B at the time of manufacture, or γ characteristics thereof, and resolution information, such as a refresh rate that is set according to the resolution. In addition, light transmission characteristics of the liquid crystal panels 925R, 925G, and 925B may be measured after manufacturing the projection display device 1, and values thereof may be recorded in the storage block 89 as the setting information of the respective liquid crystal panels 925R, 925G, and 925B.

(6) Operation of the Optical Modulation Device Driving Method(Driver Board) 80

The operation of the driver board 80 constructed as described above will now be described.

1) When the projection display device 1 is activated, the CPU 85 of the common-setting board 82 obtains setting information, such as the resolution of the respective liquid crystal panels 925R, 925G, and 925B and γ characteristics, from the switching element block 88 and the storage block 89, and sets table information for the LUTs 83R, 83G, and 83B, respectively, based on the obtained setting information. In addition, the CPU 85 outputs the obtained setting information as a status signal STS to an image output device, such as a personal computer, connected to the projection display device 1 via the input-output terminals 51.

2) An analog image signal input from the input-output terminals 51 is converted into digital form by a video substrate 15 or the like, and is supplied as an 8-bit digital image signal VIDEO for each of the colors R, G, and B to the LUTs 83R, 83G, and 83B constituting the signal processing block 83, respectively.

3) The respective LUTs 83R, 83G, and 83B use the image signal VIDEO as an index for each of the colors R, G, and B, and convert the table information corresponding to the signal VIDEO into analog form, and then output them as drive controlling signals SR, SG, and SB.

4) These drive controlling signals SR, SG, and SB are supplied to the phase expansion circuit blocks 87R, 87G, and 87B, respectively, of the individual-setting board 81 after being amplified by the amplifier 86. The phase expansion circuit blocks 87R, 87G, and 87B expand the phases of the drive controlling signals SR, SG, and SB, respectively, based on the number of expansion set according to the resolution of the liquid crystal panels 925R, 925G, and 925B, respectively, and output them to the driving system ICs (not shown) of the liquid crystal panels 925R, 925G, and 925B, respectively.

5) On the other hand, the synchronizing signal SYNC input together with the image signal VIDEO is supplied to the timing circuit block 84. The timing circuit block 84 outputs a drive timing signal ST to the signal processing block 83, the phase expansion circuit blocks 87R, 87G, and 87B, and the driving system ICs of the liquid crystal panels 925R, 925G, and 925B, respectively, based on the synchronizing signal SYNC and a control signal SC from the CPU 85, and coordinates operation of these components.

(7) Advantages of the First Embodiment

According to this embodiment, the following advantages are provided.

In the projection display device 1, the main board 12 is substantially perpendicular to a plane defined by the optical axes 1a, 1r, 1g, and 1b of the optical unit 10, and stands aside the optical unit 10, so that, if the main board 12 is designed to have a small vertical size, the vertical size, i.e., the thickness of the projection display device 1, can be reduced because the main board 12 is not disposed above the optical unit 10. Therefore, unlike the conventional projection display device in which the main board is disposed above the optical unit 10, the entire projection display device 1 can be reliably reduced in thickness and size regardless of the thickness of the main board 12.

The slit 42 with which the front lower end of the main board 12 is engaged is provided on the lower casing 4, so that the main board 12 can be maintained standing by using the slit 42 in addition to the connector 121. Therefore, even if the main board 12 is connected to the power-supply circuit board not by the connector 121 but by cables, etc., the main board 12 can be easily secured by screws with the main board 12 maintained standing.

The lower end of the main board 12 is engaged with and supported by the slit 42, so that the main board 12 may be fixed by securing screws only at the upper end thereof after being connected to the power-supply circuit board 13 via the connector 121. Therefore, a securing operation of the lower end covered by the lower casing 4 can be omitted, whereby the mounting operation thereof can be facilitated.

While the main board 12 is allowed to stand at a position where one surface thereof is in the vicinity of the inner surface of the outer casing 2, the guard member 19 is provided between the main board 12 and the outer casing 2. Therefore, interference between the upper casing 3 and the main board 12 can be prevented when the upper casing 3 is mounted to the lower casing 4. In particular, the main board 12 can be effectively prevented from being damaged. In addition, this allows the outer casing 2 to be easily mounted, whereby efficiency of assembly work can be improved.

The guard member 19 is made of metal and includes the large planar section 191 capable of covering between the top and bottom ends of the main board 12, so that the main board 12 can be protected from external noise, and malfunction of the control circuit can be prevented.

The lower end of the guard member 19 is also engaged with the slit 43, so that the guard member 19 can be fixed only at the top end thereof by the securing screw 192, whereby mounting operation thereof can be facilitated.

The electric power for driving the control circuit formed on the main board 12 is produced on the power-supply circuit board 13 that is provided separately from the main board 12, so that the control circuit becomes resistant to received noise, as compared with a case where the power supply circuit is formed on the main board 12. Therefore, the number of occurrences of the malfunction of the control circuit can be reduced, whereby reliability can be increased.

The driver board 80 as the optical modulation device driving system is divided into the individual-setting board 81 and the common-setting board 82, so that only the individual-setting board 81 may be changed even if the liquid crystal panels 925R, 925G, and 925B of the projection display device 1 have different specifications, and management of components can be rationalized and productivity of the projection display device 1 can be improved. In addition, the driver board 80 is divided into the individual-setting board 81 and the common-setting board 82, so that versatility of arrangement of the driver board 80 in the projection display device 1 is increased, whereby the projection display device 1 can be reduced in size.

The individual-setting board 81 and the common-setting board 82 are stacked, so that they can be directly electrically connected to each other by means of connectors, and the productivity of the projection display device 1 can be further improved in accordance with the simplification of wiring. In addition, both boards 81 and 82 are stacked, so that circuit elements formed on both boards 81 and 82 can be efficiently cooled by introducing cooling air drawn by the third intake fan 17C into the space between the boards 81 and 82.

The individual-setting board 81 includes the storage block 89 serving as an information carrier circuit, so that the deviation of the respective liquid crystal panels 925R, 925G, and 925B, and γ characteristics can be recorded as setting information in the storage block 89. Table information is set for the LUTs 83R, 83G, and 83B according to the characteristics of the liquid crystal panels 925R, 925G, and 925B by using the setting information in the CPU 85, and the image signal VIDEO is converted by the LUTs 83R, 83G, and 83B, whereby color reproducibility of a projected image can be suitably ensured.

The individual-setting board 81 includes the switching element block 88 serving as an information carrier circuit, so that simple information, such as the resolution of the liquid crystal panels 925R, 925G, and 925B, is carried by the switching element block 88, whereby specifications of the individual-setting board 81 can be easily determined.

The storage block 89 is composed of the E2PROM, so that the recorded information is not lost even if the power supply of the projection display device 1 is shut off, and the setting information can be stored for a long period of time.

The phase expansion circuit blocks 87R, 87G, and 87B of the individual-setting board 81 can change the number of expanded phases, so that the number of connections of the expanding ICs may be increased or decreased even if the resolution of the liquid crystal panels 925R, 925G, and 925B varies. Therefore, commonality of components can be achieved and productivity of the projection display device 1 can be further improved.

The CPU 85 outputs the status signal STS to the image output device, such as a personal computer. Therefore, when an image signal of a resolution that is not set by the projection display device 1 is set on the personal computer, this fact can be confirmed on the personal computer by the status signal.

Second Embodiment (8) Ground structure of the Main Board

While the ground line is set by fixing the main board 12 to the metal casing 250B by fixing screws in the first embodiment, the main board 12 may be grounded by a method described hereinbelow.

FIGS. 10 to 14B show a modification of the ground structure of the main board 12 as a second embodiment of the present invention. The ground structure may be applied not only to the main board 12, but also to the longitudinally disposed interface substrate 14 and the video substrate 15 (FIG. 4).

As shown in FIG. 10, the main board 12 is provided with a plurality of electrical conducting portions 61 at the lower end thereof. The points where the electrical conducting portions 61 are provided are determined according to the length of the main board 12, and noise produced therein, etc.

As shown in. FIG. 11, the electrical conducting portion 61 consists of a recess 61a that is formed on an end of the main board 12 and an end face of the recess 61a is plated so as to form a copper plated layer 61b.

More specifically, the electrical conducting portion 61 is formed by a subtractive process following the steps below.

1) In forming a through-hole for fixing a resistor, a capacitor, etc., a long hole 611 extending along and lying across the cutting plane line L is formed simultaneously in a base material 11A formed of a glass epoxy resin plate having copper plating applied to both surfaces thereof, as shown in FIG. 12A. Then, semicircular recesses 612 are further formed at both ends in the extending direction of the long hole 611, as shown in FIG. 12B.

2) Then, a copper plated layer 613 is formed on the inner peripheral end face of the long hole 611 by electroplating. Since the base material 11A is cut after copper plating is applied thereto, the recesses 612 are formed in order to prevent the copper plated layer 613 from coming off when cutting the base material 11A.

3) After masking a printed wiring portion and the copper plated layer 613, unnecessary portions of the copper plating are removed by etching, as shown in FIG. 12C.

4) Finally, when the base material 11A is cut along the cutting plane line L to be divided into the main board 12, the long hole 611 and the copper plated layer 613 are divided, and the electrical conducting portion 61 is exposed at the outer peripheral end face of the main board 12, as shown in FIG. 12D.

(9) Supporting Structure of the Main Board

The main board 12 having the structure as described above is fixed by fixing screws 122 to the side surface of the outer casing 2 at both horizontal ends thereof, and the lower end thereof is supported by a holding member 71, as shown in FIG. 10. The holding member 71 is a strip member mounted to the bottom surface of the lower casing 4 according to the position of the main board 12. As shown in FIGS. 13A and 13B, the holding member 71 includes a spongy elastic member 711 and a conductive sheet 712 into which copper is mixed, and which is provided on the outer peripheral surface of the elastic member 711 so as to enclose the elastic member 711. Conductive adhesive agents 713 and 714 are applied to the upper and lower surfaces of the holding member 71.

In supporting the main board 12 by the holding member 71, the holding member 71 is compressively deformed to support the main board 12 with the electrical conducting portion 61 buried, as shown in FIGS. 14A and 14B. The electrical conducting portion 61 of the main board 12 and a shield plated layer 2a formed on the bottom surface of the lower casing 4 are electrically connected via the conductive sheet 712 of the holding member 71. In mounting the main board 12 to the outer casing 2, 1)the holding member 71 is bonded according to the position of the main board 12 in the outer casing 2, 2)the main board 12 is pressed down, and 3)the main board 12 is fixed by the fixing screws 122 while compressively deforming the holding member 71.

(10) Advantages of the Second Embodiment

According to the second embodiment, the following advantages are provided.

The electrical conducting portion 61 is provided at the lower end of the main board 12, so that the electrical conducting portion 61 and the shield plated layer 2a formed on the bottom surface of the outer casing 2 can be electrically connected via the holding member 71, whereby generation and intrusion of noise in the main board 12 are prevented, and a stable circuit operation can be ensured.

The electrical conducting portion 61 is formed of the copper plated layer 61b, so that, in forming the printed wiring on the main board 12, the electrical conducting portion 61 can be formed simultaneously in a step for forming the through-hole, whereby manufacturing of the main board 12 including the electrical conducting portion 61 can be facilitated.

The main board 12 and the shield plated layer 2a are connected via the conductive sheet 712 of the holding member 71, so that it is not necessary to provide a special connecting line on the main board 12, and the main board 12 and the shield plated layer 2a can be easily electrically connected.

The holding member 71 is composed of the spongy elastic member, so that the holding member 71 is deformed according to the contact condition of the main board 12, whereby electrical connection between the electrical conducting portion 61 and the holding member 71 can be positively effected. Furthermore, the main board 12 is supported by the elastic holding member 71, so that the main board 12 can be securely held and fixed to the inside of the outer casing 2 even if fixed points of the fixing screws 121 are not sufficiently conserved.

The ground section is composed of the shield plated layer 2a formed on the inner surface of the casing, so that the ground section can be easily formed in the outer casing 2, the ground section can be simplified, and the inner structure of the projection display device 1 can be simplified, whereby the size of the projection display device 1 can be further reduced.

(11) Modifications

The present invention is not limited to the above-described embodiments, and includes other features capable of achieving the objects of the present invention, and the following modifications are also included in the present invention.

For example, while the slit 42 is provided as a supporting section for the main board 12 in the first embodiment, the shape of the supporting section according to the present invention is not limited thereto, and may be voluntarily decided in consideration of the shape and structure of the outer casing. In brief, the supporting section may have any shape so long as it can maintain the standing condition of the main board 12.

While the guard member 19 is fixed to the metal casing 250B of the second power supply block 7B in the first embodiment, the guard member 19 may be directly fixed to, for example, the main board 12, and this allows the guard member 19 to be used as a radiating plate for the main board 12. The guard member 19 may be made of synthetic resin, etc. In this case, the effect of preventing damage of the main board can also be obtained. Such a guard member 19 may not be provided in the projection display device.

While the power-supply circuit is formed on the power-supply circuit board 13 that is provided separately from the main board 12 in the first embodiment, the power-supply circuit may be formed on the main board 12.

While the common-setting board 82 is stacked above the individual-setting board 81 in the first embodiment, the position of the common-setting board 82 is not limited thereto. That is, the common-setting board 82 may be longitudinally disposed similarly to the main-board 12. In brief, the position of the common-setting board 82 may be suitably changed so long as the size of the projection display device can be advantageously reduced.

While the storage block 89 is composed of the E2PROM in the first embodiment, the storage block 89 may be composed of an EPROM or a RAM capable of maintaining power supply by means of an internal battery, etc.

The liquid crystal panels 925R, 925G, and 925B are employed as optical modulation devices in the first embodiment. However, even if the present invention is applied to a modulation device using light emitting element (ELD), a modulation device using a polymer dispersed liquid crystal (PDP), and a modulation device using a micro-mirror (DMD), the effect similar to that of the first and second embodiments can be provided.

The projection display device 1 includes three liquid crystal panels 925R, 925G, and 925B. However, even if the present invention is applied to a projection display device including a single optical modulation device, the effect similar to that of the first and second embodiments can be provided.

While a plurality of electrical conducting portions 61 are provided at the lower end of the main board 12 in the second embodiment, the electrical conducting portions 61 may be formed on both left and right ends, or on the upper end of the longitudinally disposed circuit board.

While the present invention is applied to the longitudinally disposed main board 12 in the second embodiment, the present invention may be applied to a horizontally disposed circuit board.

While the recess 61*a* is formed in the main board 12, and the copper plated layer 61*b* is formed on the end face of the recess 61*a* to form the electrical conducting portion 61 in the second embodiment, the electrical conducting portion may be formed by a metal plate that is mechanically fitted to a circuit board and covers the outer peripheral end face of the circuit board. This allows the electrical conducting portion to be formed over the entire outer peripheral end face of the circuit board, so that the electrical connection with the ground section can be established at any position along the outer peripheral end of the circuit board provided with the electrical conducting portion.

In the second embodiment, the main board 12 and the holding member 71, and the shield plated layer 2*a* and the holding member 71 are bonded by the conductive adhesive agents 713 and 714 applied to the entire upper and lower surfaces of the holding member 71. However, bonding of these components is not limited thereto. That is, as shown in FIG. 15A, the main board 12 may be held by a holding member 91 having no conductive adhesive agent applied to the upper surface thereof but having a nonconductive adhesive agent 914 applied to a part of substantially the widthwise center of the lower surface thereof. In this case, as shown in FIG. 15B, when an elastic member 911 of the holding member 91 is compressively deformed by the main board 12, a widthwise end of a conductive sheet 912 of the holding member 91 is brought into contact with the shield plated layer 2*a*, whereby electrical connection therebetween is ensured.

The holding member 71 is square in cross section, and is connected to the main board 12 via the conductive adhesive agents 713 and 714 in the second embodiment. However, a holding member may have a groove that is narrower than the thickness of the circuit board so as to insert therein the circuit board. Such a holding member does not require the application of the adhesive agent on the upper surface thereof.

While the ground section is composed of the shield plated layer 2*a* formed on the inner surface of the outer casing 2 in the second embodiment, a metal plate may be attached onto the inner surface of the outer casing so as to be used as a ground section, and the outer casing may be made of metal.

Any material may be used for the base material of the main board 12. A base material made of a generally used glass epoxy resin sheet, or a base material made of plastic, ceramics or paper epoxy or the like may be used. In this case, the effect similar to that of the first and second embodiments can be provided.

While the present invention is applied to the projection display device 1 in the first and second embodiments, the present invention may be applied to another electronic apparatus, such as a computer.

What is claimed is:

1. A projector, comprising:
   an optical system having optical axes defining a plane that optically processes a luminous flux emitted from a light source to form an optical image according to image information;
   a projection lens that enlarges and projects an image formed by the optical system;
   a circuit board that controls the projector,
   a casing that substantially covers the optical system, the projection lens, and the circuit board in entirety, said circuit board being substantially perpendicular to the plane defined by the optical axes of said optical system and disposed on an outside of said plane defined in said optical system; and
   an optical modulation-device driving system that drives and controls an optical modulation device constituting said optical system, said optical-modulation-device driving system being divided into an individual-setting section set according to specifications of said optical-modulation-device and a common-setting section set in common without depending on the specifications of said optical-modulation-device.

2. The projector according to claim 1, one surface of said circuit board being adjacent and opposed to an inner surface of said casing, and the projector further comprising a guard member provided between said circuit board and said casing to prevent interference therebetween.

3. The projector according to claim 2, said guard member comprising a metal, and including a planar section that covers a predetermined area of said circuit board.

4. The projector according to claim 1, said casing comprising a supporting section that supports said circuit board.

5. The projector according to claim 1, further comprising a power-supply circuit board including a power-supply circuit thereon provided separately from said circuit board, an electric power that drives a control circuit on said circuit board being produced by the power-supply circuit on said power-supply circuit board.

6. The projector according to claim 1, said casing comprising a ground section that prevents radiation of noise produced inside said casing and that prevents intrusion of external noise into said casing, and
   said circuit board comprising an electrical conducting portion provided on an outer peripheral end of said circuit board and electrically connected to said ground section.

7. The projector according to claim 6, said electrical conducting portion comprising a metal conducting portion formed on at least a part of said outer peripheral end.

8. The projector according to claim 6, said casing comprising a holding member electrically connected to said ground section and holding said circuit board, said electrical conducting portion and said ground section being electrically connected via said holding member.

9. The projector according to claim 8, said holding member comprising an elastic member deformed according to a contact condition of said circuit board.

10. The projector according to claim 9, said holding member comprising a spongy elastic member and a conductive sheet provided on an outer peripheral surface of said elastic member.

11. The projector according to claim 8, said ground section comprising a shield plated layer formed on an inner surface of said casing.

12. A projector comprising:

an optical system that optically processes a luminous flux emitted from a light source to form an optical image according to image information;

a projection lens that enlarges and projects an image formed by the optical system; and an optical-modulation-device driving system that drives and controls an optical modulation device constituting said optical system, said optical-modulation-device driving system being divided into an individual-setting section set according to specifications of said optical modulation device and a common-setting section set in common without depending on the specifications of said optical modulation device.

13. The projector according to claim 12, said individual-setting section and said common-setting section being formed on two separate circuit boards, respectively, and said circuit boards being stacked.

14. The projector according to claim 13, said individual-setting section comprising an information carrier circuit that carries setting information for said optical modulation device, and said common-setting section comprising a correction circuit that obtains setting information for said optical modulation device from said information carrier circuit, corrects image information based on the setting information, and outputs the corrected information.

15. The projector according to claim 14, said information carrier circuit comprising selectable switching elements.

16. The projector according to claim 14, said information carrier circuit comprising a non-volatile storage unit that records therein the setting information for said optical modulation device.

17. A circuit board accommodated in a casing together with a driving system of an electronic apparatus to electrically control said driving system, said casing comprising:

a ground section that prevents radiation of noise produced inside said casing and that prevents intrusion of external noise into said casing; and an electrical conducting portion provided on an outer peripheral end of said circuit board and electrically connected to said ground section.

18. The circuit board according to claim 17, said electrical conducting portion comprising a metal conducting portion formed on at least a part of said outer peripheral end.

19. An electronic apparatus comprising:

a driving system;

a circuit board that electrically controls said driving system; and a casing that accommodates therein said driving system and said circuit board, said casing comprising a ground section that prevents radiation of noise produced inside said casing and that prevents intrusion of external noise into said casing, and a holding member electrically connected to said ground section and holding said circuit board, said circuit board comprising an electrical conducting portion formed on an outer peripheral end of said circuit board and electrically connected to said ground section, and said electrical conducting portion and said ground section being electrically connected via said holding member.

20. The electronic apparatus according to claim 19, said holding member comprising an elastic member deformed according to a contact condition of said circuit board.

21. The electronic apparatus according to claim 20, said holding member comprising a spongy elastic member and a conductive sheet provided on an outer peripheral surface of said elastic member.

22. The electronic apparatus according to claim 19, said ground section comprising a shield plated layer formed on an inner surface of said casing.

* * * * *